US 11,280,813 B2

(12) United States Patent
Hebiguchi et al.

(10) Patent No.: US 11,280,813 B2
(45) Date of Patent: Mar. 22, 2022

(54) CURRENT SENSOR

(71) Applicant: Alps Alpine Co., Ltd., Tokyo (JP)

(72) Inventors: Hiroyuki Hebiguchi, Miyagi-ken (JP);
Manabu Tamura, Miyagi-ken (JP);
Eiichiro Matsuyama, Miyagi-ken (JP)

( * ) Notice: Subject to any disclaimer, the term of this patent is extended or adjusted under 35 U.S.C. 154(b) by 76 days.

(21) Appl. No.: 16/533,323

(22) Filed: Aug. 6, 2019

(65) Prior Publication Data
US 2019/0361054 A1    Nov. 28, 2019

Related U.S. Application Data

(63) Continuation of application No. PCT/JP2018/003785, filed on Feb. 5, 2018.

(30) Foreign Application Priority Data

Mar. 6, 2017    (JP) .............................. JP2017-041787

(51) Int. Cl.
| | | |
|---|---|---|
| *G01R 15/14* | (2006.01) | |
| *G01R 15/18* | (2006.01) | |
| *G01R 19/00* | (2006.01) | |
| *G01R 21/08* | (2006.01) | |
| *G01R 33/00* | (2006.01) | |
| *G01R 33/02* | (2006.01) | |
| *G01B 7/06* | (2006.01) | |
| *G01R 15/20* | (2006.01) | |

(52) U.S. Cl.
CPC ......... *G01R 15/207* (2013.01); *G01R 15/148* (2013.01)

(58) Field of Classification Search
CPC ........ G01R 15/14; G01R 15/18; G01R 15/20; G01R 19/00; G01R 21/08; G01R 33/00; G01R 33/02; G01R 33/05; G01R 33/09; G01B 7/06
See application file for complete search history.

(56) References Cited

U.S. PATENT DOCUMENTS

| | | | |
|---|---|---|---|
| 6,459,255 B1 * | 10/2002 | Tamai ................. | G01R 15/202 |
| | | | 324/117 H |
| 6,512,359 B1 | 1/2003 | Tamai et al. | |
| 7,898,240 B2 | 3/2011 | Shibahara et al. | |
| 9,435,829 B2 * | 9/2016 | Hebiguchi ........... | G01R 15/202 |

(Continued)

FOREIGN PATENT DOCUMENTS

| | | |
|---|---|---|
| JP | 2001-074783 | 3/2001 |
| JP | 2013-044705 | 3/2013 |
| JP | 2016-197052 | 11/2016 |

OTHER PUBLICATIONS

International Search Report from corresponding International Application No. PCT/JP2018/003785, dated May 1, 2018, 3pgs.

*Primary Examiner* — Neel D Shah
(74) *Attorney, Agent, or Firm* — Crowell & Moring LLP

(57) ABSTRACT

A current sensor includes a substrate, a first bus bar, and a second bus bar. The first bus bar has a first detection recess recessed in a square U-shape upstream in the extending direction (in the Y-direction) and a first adjustment recess downstream, with a first intermediate portion therebetween. The bottom surface of the first detection recess is a first bottom surface. The first sensitive axis of a first magnetoelectric conversion element, if extended toward the second bus bar, abuts the body of the second bus bar at a portion where a second adjustment recess is provided.

5 Claims, 4 Drawing Sheets

(56) References Cited

U.S. PATENT DOCUMENTS

| | | | |
|---|---|---|---|
| 10,274,523 B2* | 4/2019 | Shimizu | G01V 3/108 |
| 2012/0112365 A1 | 5/2012 | Ausserlechner et al. | |
| 2017/0003323 A1* | 1/2017 | Nakayama | H02M 7/003 |
| 2018/0031613 A1* | 2/2018 | Nakayama | G01R 33/05 |

* cited by examiner

CURRENT SENSOR

CLAIM OF PRIORITY

This application is a Continuation of International Application No. PCT/JP2018/003785 filed on Feb. 5, 2018, which claims benefit of priority to Japanese Patent Application No. 2017-041787 filed on Mar. 6, 2017. The entire contents of each application noted above are hereby incorporated by reference.

BACKGROUND

1. Field of the Disclosure

The present disclosure relates to current sensors that calculate a current value based on a magnetic field generated by a current to be measured and, in particular, to a current sensor that reduces the influence of bus bars located next to it.

2. Description of the Related Art

An example of the current sensors that calculate a current value based on a magnetic field generated by a current to be measured is disclosed in Japanese Unexamined Patent Application Publication No. 2015-152418. The current sensor disclosed in Japanese Unexamined Patent Application Publication No. 2015-152418 is disposed in the vicinity of bus bars that transmit three-phase alternate current power to a three-phase alternating current motor to measure the current flowing through these bus bars with magneto-electric conversion elements.

The current sensor with this type of bus bars has a plurality of metal plates which are disposed vertically parallel to each other, with their plate thickness surfaces disposed on the top and the bottom. The metal plates each have a rectangular cutout from one of (above) the plate thickness end faces. The magneto-electric conversion elements are disposed in the cutout portions to measure the current flowing through the bus bars.

The current sensor in Japanese Unexamined Patent Application Publication No. 2015-152418 discloses a technique for adjusting the height position of each magneto-electric conversion elements in accordance with the shape of the adjacent bus bar in detecting the current through the bus bar to be detected in front or behind a portion whose cross-sectional shape viewed from the extending direction of the adjacent bus bar changes in a step shape along the extending direction.

Specifically, the bus bar to be measured at a position facing the adjacent bus bar is provided with a cutout 32 downstream from a portion 31 of the adjacent bus bar whose cross-sectional shape changes in a step shape in the extending direction. The bottom surface of the cutout portion is made low, and a current flowing through the bus bar to be measured is detected using a magneto-electric conversion element 33 disposed so as to face the bottom surface.

In the current sensor disclosed in Japanese Unexamined Patent Application Publication No. 2015-152418, the cross-sectional areas of the portion 31 of the adjacent bus bar whose shape changes in a step shape and a portion 34 of the bus bar to be measured on which the magneto-electric conversion element 33 is disposed are small, as illustrated in FIG. 5, disadvantageously causing an increase in electric resistance.

SUMMARY

A current sensor includes a plurality of bus bars disposed parallel to each other and a magneto-electric conversion element configured to detect an induction magnetic field generated due to a current flowing through the bus bars. Assuming that a direction in which the current flows is an extending direction, a direction in which an adjacent bus bar is disposed is a lateral direction, and a direction perpendicular to the lateral direction as viewed from the extending direction is a vertical direction, the plurality of bus bars include at least a first bus bar and a second bus bar located next to the first bus bar. The first bus bar has a first detection recess recessed from one edge to another edge in the vertical direction and having a first bottom surface on which the magneto-electric conversion element is disposed and a first adjustment recess disposed with a certain distance from the first detection recess in the extending direction and recessed from the another edge to the one edge in the vertical direction. The second bus bar has a second detection recess recessed from one edge to another edge in vertical direction and having a second bottom surface on which the magneto-electric conversion element is disposed and a second adjustment recess disposed, with a certain distance from the second detection recess in the extending direction, and recessed from the another edge to the one edge in the vertical direction. The magneto-electric conversion element includes a first magneto-electric conversion element whose sensitive axis is directed in the lateral direction, and a second magneto-electric conversion element whose sensitive axis is directed in the lateral direction, the second bus bar is disposed at a position where a side of a portion having the second adjustment recess faces the first magneto-electric conversion element. The first bus bar is disposed at a position where a side of a portion having the first adjustment recess faces the second magneto-electric conversion element.

In the current sensor of the present invention, the first bus bar and the second bus bar each have a detection recess recessed from one side in the vertical direction and an adjustment recess recessed from the other side. A side of a portion of the second bus bar where the adjustment recess is provided is located in the lateral direction of the first magneto-electric conversion element disposed in the first detection recess of the first bus bar. A side of a portion of the first bus bar where the adjustment recess is provided is located in the lateral direction of the second magneto-electric conversion element disposed in the second detection recess of the second bus bar.

Since both the first bus bar and the second bus bar have an adjustment recess, the detection recess can be small in depth, so that a portion where the electrical resistance is extremely high is not formed unlike the bus bars describe in Japanese Unexamined Patent Application Publication No. 2015-152418. Thus, the present invention can suppress an increase in electrical resistance and reduce the influence of the magnetic field from the adjacent bus bar.

With this configuration, the recessed portions of the first bus bar and the second bus bar are recessed mutually symmetrically in the vertical direction. This balances the strength of the overall configuration of the first bus bar and the second bus bar, thus improving the strength as a whole.

DESCRIPTION OF THE EXEMPLARY EMBODIMENTS

Figure 1:
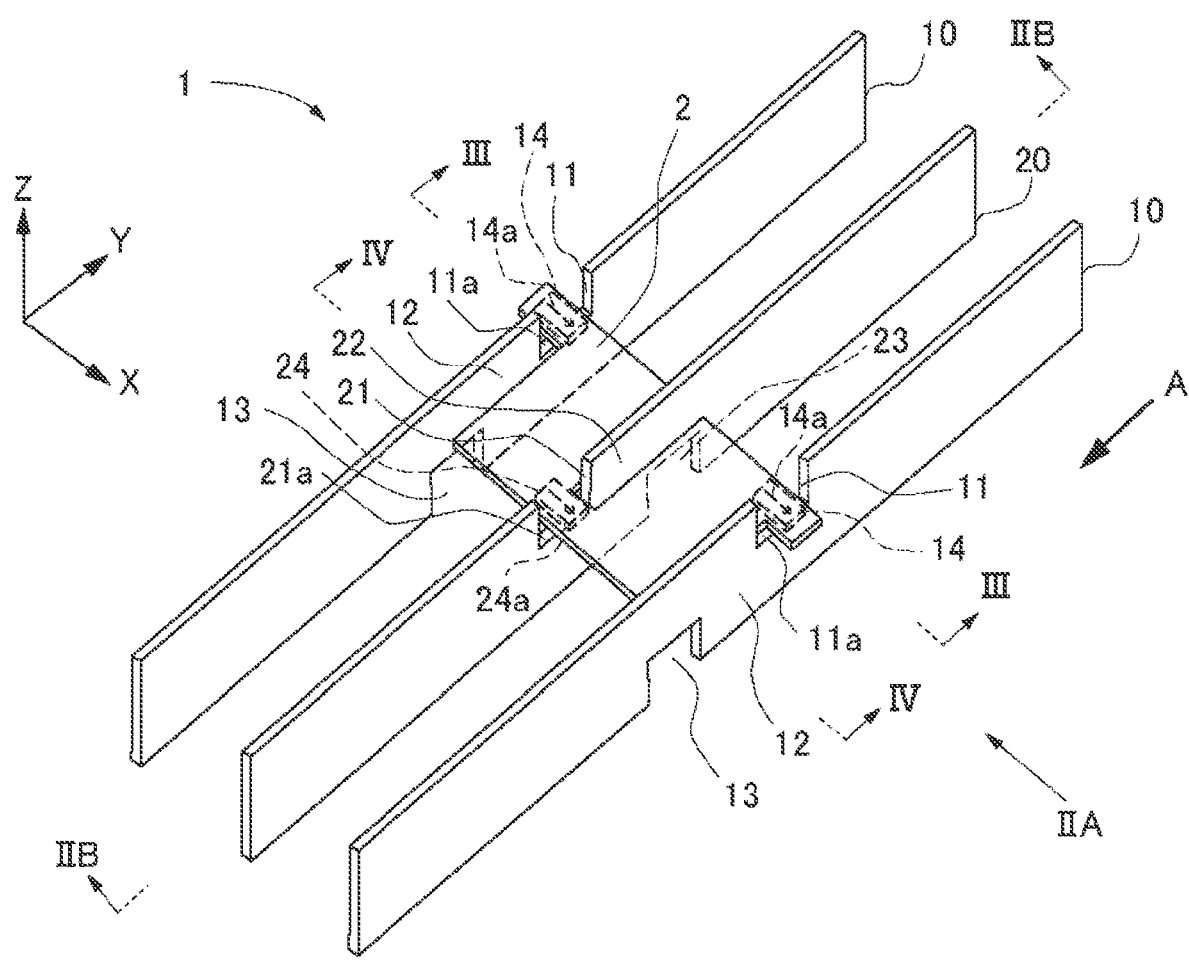
FIG. 1 is a schematic perspective view of a current sensor which is an exemplary embodiment of the present invention.

An embodiment of the present invention will be described with reference to FIGS. 1 to 4. As illustrated in FIG. 1, a current sensor 1 of the present embodiment includes three bus bars disposed parallel to each other, each having a cutout portion, in which a substrate on which magneto-electric conversion elements are mounted is placed. An example of the magneto-electric conversion elements is a magnetoresistive sensor.

Figure 2A:
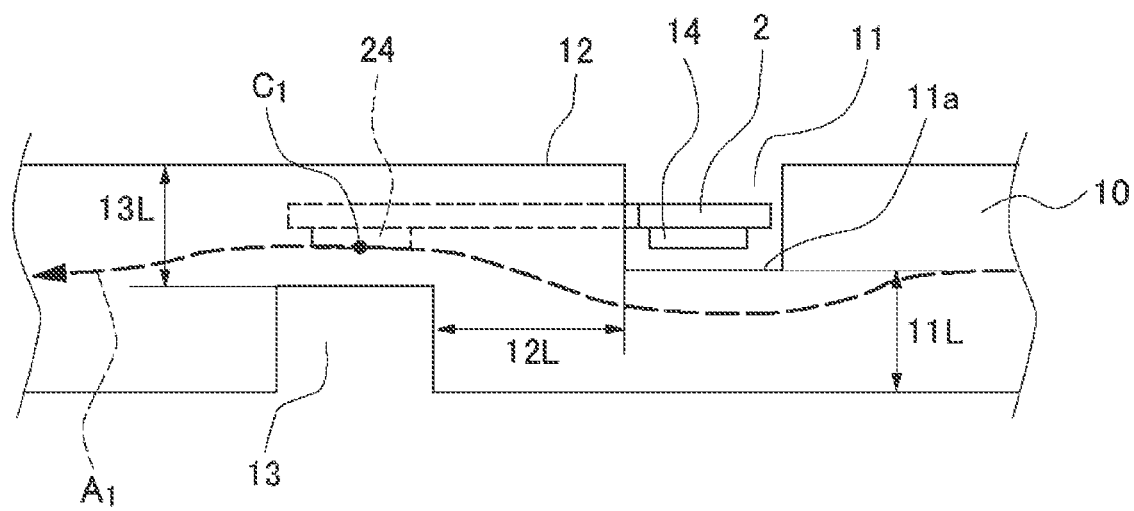
FIG. 2A is a cross-sectional view of a first bus bar taken on arrow IIA in FIG. 1.
Figure 2B:
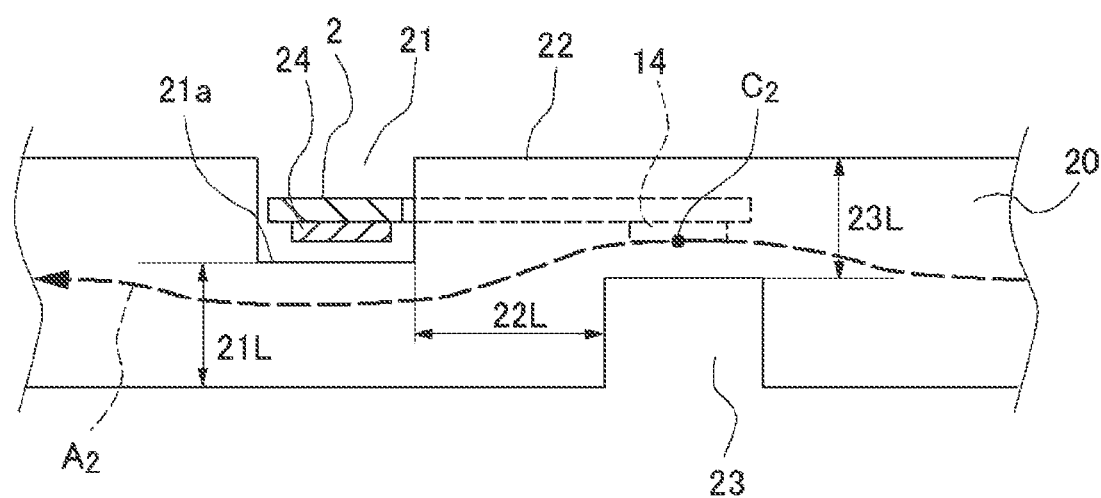
FIG. 2B is a cross-sectional view of a second bus bar taken on line IIB-IIB in FIG. 1.

In FIG. 1, the bus bars are such that first bus bars 10 are disposed on the near side and the back, between which a second bus bar 20 is disposed. As illustrated in FIG. 1 and FIGS. 2A and 2B, the first bus bars 10 and the second bus bar 20 are formed by press-working a metal plate and are disposed, with the plate thickness direction orientated in the vertical direction (the Z-direction in FIG. 1) and in the extending direction (the Y-direction in FIG. 1). The sides of the bus bars are orientated in the X-direction in FIG. 1.

In the present embodiment, current flows from the upper right to the lower left in FIG. 1 (arrow A in FIG. 1). As illustrated in FIG. 1 and FIG. 2A, the first bus bar 10 has a first detection recess 11, at an upstream position in the extending direction, which is recessed downward from the upper end in a square U-shape (in a rectangular shape), and a first adjustment recess 13 recessed upward from the lower end, downstream with a first intermediate portion 12 having no recess therebetween. The bottom surface of the first detection recess 11 is a plate thickness surface of the first bus bar 10, and this plate thickness surface is a first bottom surface 11a.

In the present embodiment, as illustrated in FIG. 2A, the first detection recess 11 and the first adjustment recess 13 have the same length in the extending direction and the same depth in the vertical direction. The length 12L of the first intermediate portion 12 in the extending direction is longer than the height 11L of the first bus bar 10 in the vertical direction where the first detection recess 11 is located and the height 13L of the first bus bar 10 in the vertical direction where the first adjustment recess 13 is located.

In the present embodiment, the second bus bar 20 has a symmetrical positional relationship with the first bus bar 10. Specifically, a second adjustment recess 23 recessed upward from the lower end is provided upstream in the extending direction, and a second detection recess 21 recessed downward from the upper end is provided downstream, with a second intermediate portion 22 having no recess therebetween. The bottom surface of the second detection recess 21 is a plate thickness surface of the second bus bar 20, and the plate thickness surface is a second bottom surface 21a.

Also in the second bus bar 20, like the first bus bar 10, the length 22L of the second intermediate portion 22 in the extending direction is longer than the height 21L of the second bus bar 20 in the vertical direction where the second detection recess 21 is located, and the height 23L of the second bus bar 20 in the vertical direction where the second adjustment recess 23 is located.

The magneto-electric conversion elements of the present embodiment include first magneto-electric conversion elements 14 and a second magneto-electric conversion element 24, as illustrated in FIGS. 1 to 4. The first magneto-electric conversion elements 14 and the second magneto-electric conversion element 24 are mounted on a common substrate 2. In the present embodiment, the first magneto-electric conversion elements 14 and the second magneto-electric conversion element 24 are disposed on the back of the substrate 2 so as to respectively face first bottom surfaces 11a and a second bottom surface 21a. The other configuration of the substrate 2 is not illustrated.

Each first magneto-electric conversion element 14 is disposed so that a surface parallel to the surface of the substrate 2 is parallel to the first bottom surface 11a of the first bus bar 10. As illustrated in FIG. 1, the first magneto-electric conversion element 14 is disposed so that a first sensitive axis 14a which is its sensitive axis (the arrow in the first magneto-electric conversion element 14 in FIG. 1) is directed in the X-direction. The first magneto-electric conversion element 14 is disposed at a position facing a side of the adjacent second bus bar 20, specifically, a position facing a side of the second adjustment recess 23. In other words, the first sensitive axis 14a, if extended toward the second bus bar 20, abuts the body of the second bus bar 20 at a position where the second adjustment recess 23 of the second bus bar 20 is provided.

Like the first magneto-electric conversion element 14, the second magneto-electric conversion element 24 is disposed so that a surface parallel to the surface of the substrate 2 is parallel to the second bottom surface 21a of the second bus bar 20. A second sensitive axis 24a of the second magneto-electric conversion element 24 (the arrow in the second magneto-electric conversion element 24 in FIG. 1) is perpendicular to a side of the adjacent first bus bar 10, specifically, a side of the first adjustment recess 13. In other word, the second sensitive axis 24a, if extended toward the first bus bar 10, abuts the body of the first bus bar 10 at a portion where the first adjustment recess 13 of the first bus bar 10 is provided.

Next, the operation of the current sensor 1 of the present embodiment when detecting current through the first bus bar 10 and the second bus bar 20 will be described. In FIGS. 2A and 2B, the dotted lines denoted by reference signs A1 and A2 indicate the center of the flow of the current in the first bus bar 10 and the second bus bar 20.

When current flows through the first bus bar 10, the flow of the current from the right is curved downward due to the presence of the first detection recess 11, as illustrated in FIG. 2A. The current passes through a position slightly above the center position of the height 11L of the first bus bar 10 in the vertical direction where the first detection recess 11 is located and flows in to the first intermediate portion 12.

When passing through the first intermediate portion 12, the current is curved upward due to the presence of the downstream first adjustment recess 13. The current passes through a position slightly lower than the center position of the height 13L of the first bus bar 10 in the vertical direction where the first adjustment recess 13 is located and flows through the downstream first bus bar 10 having no recess.

In contrast, when current flows through the second bus bar 20, the flow of the current from the right is curved upward due to the presence of the second adjustment recess 23, as illustrated in FIG. 2B. The current passes through a position slightly lower than the center position of the height 23L of the second bus bar 20 in the vertical direction where the second adjustment recess 23 is located and flows into the second intermediate portion 22.

When passing through the second intermediate portion 22, the current is curved downward due to the presence of the downstream second detection recess 21. The current passes through a position slightly above the center position of the height 21L of the second bus bar 20 in the vertical direction where the second detection recess 21 is located and flows to the downstream second bus bar 20 having no recess.

Figure 3:
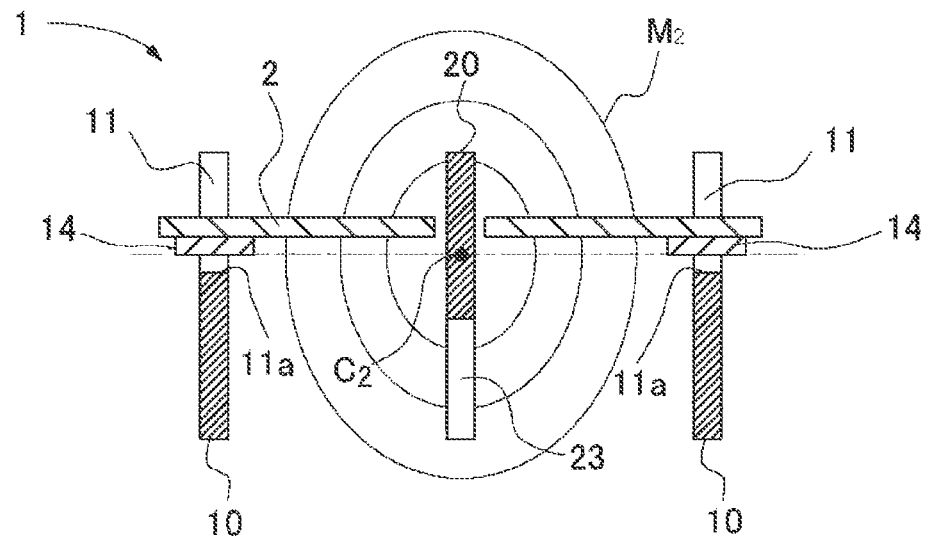
FIG. 3 is a cross-sectional view taken on line III-III in FIG. 1.

In the present embodiment, the substrate 2 is disposed so that the first magneto-electric conversion element 14 is located at a lateral position relative to the center of the current indicated by reference sign C2 in FIG. 2B. Thus, the influence of a magnetic field M2 from the adjacent second bus bar 20 on the first magneto-electric conversion element 14 is reduced, as illustrated in FIG. 3.

Figure 4:
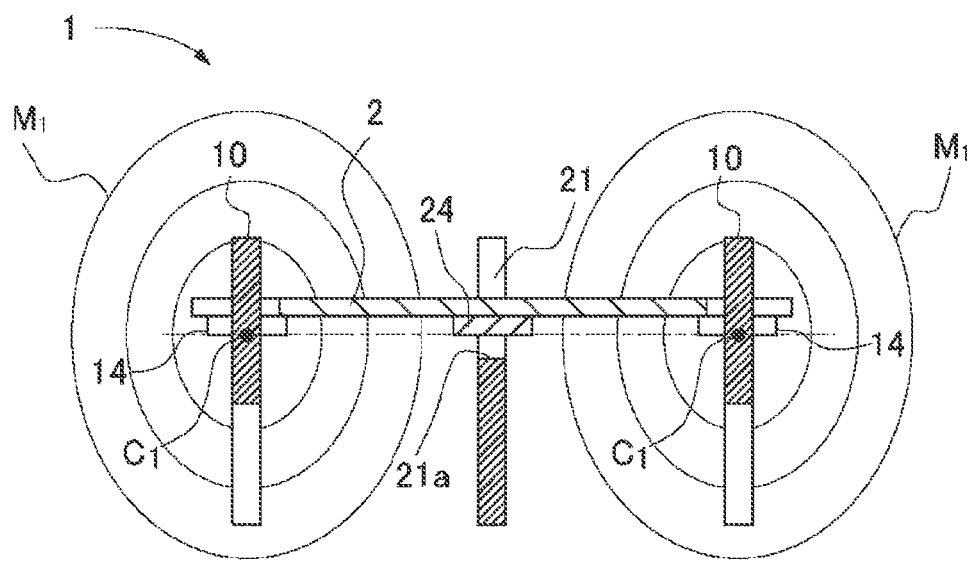
FIG. 4 is a cross-sectional view taken on line IV-IV in FIG. 1.
Figure 5:
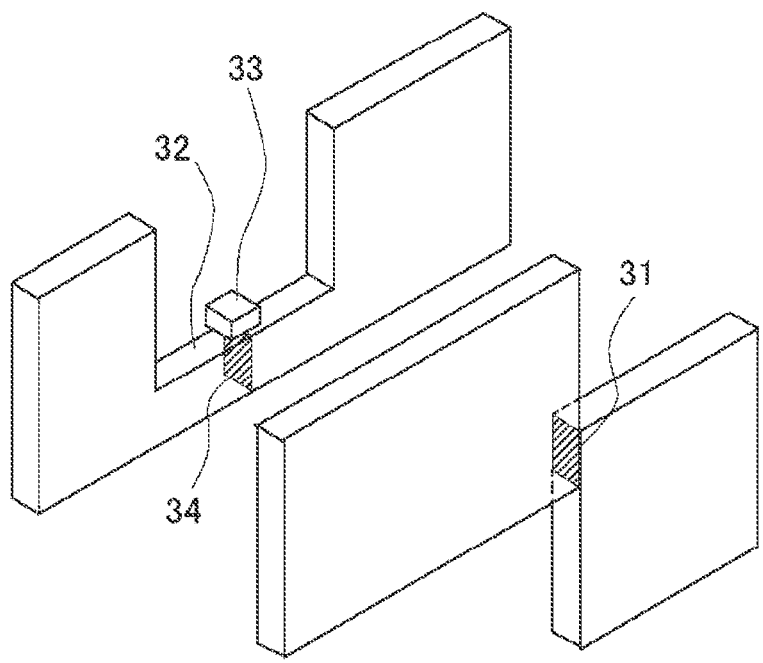
FIG. 5 is a schematic perspective view of a known current sensor.

The substrate 2 is disposed so that the second magneto-electric conversion element 24 is located at the lateral position relative to the center of the current indicated by reference sign C1 in FIG. 2A. Thus, the influence of a magnetic field M1 from the adjacent first bus bar 10 on the second magneto-electric conversion element 24 is reduced, as illustrated in FIG. 4.

In the present embodiment, each bus bar has not a portion where the current path is extremely narrowed in side view, as illustrated in FIGS. 2A and 2B. This allows preventing an increase in local electric resistance in each bus bar and also preventing a decrease in the mechanical strength of each bus bar.

Although in the above embodiment the number of first bus bars 10 is two, and the number of second bus bars 20 is one, the number of second bus bars 20 may be two, and the number of first bus bars 10 may be one. The number of bus bars is not limited to three and may be any number.

The length 12L of the first intermediate portion 12 in the extending direction is larger than the height 11L of the first bus bar 10 in the vertical direction where the first detection recess 11 is located and the height 13L of the first bus bar 10 in the vertical direction where the first adjustment recess 13 is located. This setting prevents a decrease in the cross-sectional area of the current path in the first intermediate portion 12 so as not to increase the resistance. The length 12L of the first intermediate portion 12 in the extending direction may be equal to or smaller than the height 11L of the first bus bar 10 in the vertical direction where the first detection recess 11 is present and the height 13L of the first bus bar 10 in the vertical direction where the first adjustment recess 13 is present unless problems such as an increase in resistance occur. The same applies to the length 22L of the second intermediate portion 22 of the second bus bar in the extending direction.

Although the first bus bars 10 and the second bus bar 20 have the shapes illustrated in FIGS. 1 to 4, this is given for illustrative purposes only. The first bus bars 10 and the second bus bar 20 may have different shapes. For example, the corner of each bus bar where the recess is provided is right-angled, but the angle may be changed, or alternatively, the corner may be chamfered in a straight or arc shape.

Examples of the magneto-electric conversion elements include, in addition to the magnetoresistive sensor, a Hall element and other kinds of element. In the case of the Hall element, in the present invention, the direction of the normal to the magnetosensitive surface is defined as the direction of the sensitive axis.

What is claimed is:
1. A current sensor comprising:
a plurality of bus bars disposed parallel to each other; and
a magneto-electric conversion element configured to detect an induction magnetic field generated due to a current flowing through the bus bars,
wherein: a direction in which the current flows is an extending direction, a direction in which an adjacent bus bar is disposed is a lateral direction, and a direction perpendicular to the lateral direction as viewed from the extending direction is a vertical direction,
the plurality of bus bars include at least a first bus bar and a second bus bar located next to the first bus bar,
the first bus bar and the second bus bar have a flat plate shape, and are arranged so that their plate surfaces face each other,
the first bus bar has a first detection recess recessed from one edge to another edge in the vertical direction and having a first bottom surface on which the magneto-electric conversion element is disposed and a first adjustment recess disposed distally in the extending direction from the first detection recess and recessed from the another edge to the one edge in the vertical direction,
the second bus bar has a second detection recess recessed from one edge to another edge in vertical direction and having a second bottom surface on which the magneto-electric conversion element is disposed and a second adjustment recess disposed distally in the extending direction from the second detection recess and recessed from the another edge to the one edge in the vertical direction,
the magneto-electric conversion element includes a first magneto-electric conversion element whose sensitive axis is directed in the lateral direction, and a second magneto-electric conversion element whose sensitive axis is directed in the lateral direction,
the second bus bar is disposed at a position where the second adjustment recess faces and is aligned in the vertical direction with the first magneto-electric conversion element, and
the first bus bar is disposed at a position where the first adjustment recess faces and is aligned in the vertical direction with the second magneto-electric conversion element.
2. The current sensor according to claim 1,
wherein the first detection recess and the first adjustment recess have an equal depth in the vertical direction, and
wherein the second detection recess and the second adjustment recess have an equal depth in the vertical direction.
3. The current sensor according to claim 2,
wherein a length between the first detection recess and the first adjustment recess in the extending direction is equal to or larger than lengths of portions in the vertical direction where the first detection recess and the first adjustment recess are provided, and
wherein a length between the second detection recess and the second adjustment recess in the extending direction is equal to or larger than lengths of portions in the vertical direction where the second detection recess and the second adjustment recess are provided.
4. The current sensor according to claim 1, wherein the first magneto-electric conversion element and the second magneto-electric conversion element are mounted on one surface of a common substrate.

5. The current sensor according to claim 4,
wherein the first detection recess, the first adjustment recess, the second detection recess, and the second adjustment recess are equal in length in the extending direction and depth in the vertical direction, and
wherein the first magneto-electric conversion element and the second magneto-electric conversion element are magneto-electric conversion elements having same characteristics.

\* \* \* \* \*